United States Patent [19]

Dixon et al.

[11] Patent Number: 5,038,057
[45] Date of Patent: Aug. 6, 1991

[54] ECL TO CMOS LOGIC TRANSLATOR

[75] Inventors: Robert Dixon, Chandler; Walter Seelbach, Fountain Hills, both of Ariz.

[73] Assignee: Motorola, Inc., Schaumburg, Ill.

[21] Appl. No.: 529,833

[22] Filed: May 29, 1990

[51] Int. Cl.⁵ ............... H03K 14/092; H03K 14/094
[52] U.S. Cl. .................................. 307/475; 307/446; 307/455
[58] Field of Search .............. 307/475, 443, 446, 455

[56] References Cited

U.S. PATENT DOCUMENTS

| | | | |
|---|---|---|---|
| 4,453,095 | 6/1984 | Wrathall | 307/475 |
| 4,563,601 | 1/1986 | Asano et al. | 307/443 |
| 4,644,194 | 2/1987 | Birritella | 307/443 |
| 4,697,109 | 9/1987 | Honma et al. | 307/446 |
| 4,794,317 | 12/1988 | Van Tran | 307/446 |
| 4,797,583 | 1/1989 | Ueno et al. | 307/446 |
| 4,906,871 | 3/1990 | Iida | 307/443 |

Primary Examiner—David Hudspeth
Assistant Examiner—Andrew Sanders
Attorney, Agent, or Firm—Michael D. Bingham

[57] ABSTRACT

A voltage translator circuit is responsive to applied ECL input signals for providing corresponding CMOS level logic output signals therefrom. The voltage translator circuit includes a pair of substantially identical translator circuits each having an input coupled to an input of the voltage translator circuit and which are supplied a regulated voltage such that the operation thereof is substantially independent of negative power supply variations and temperature. An output stage is coupled between the output of one of the pair of translator circuits and the output of the voltage translator circuit while the output of the other translator circuit is coupled to the output of the voltage translator circuit in order to provide the CMOS level logic output signals.

10 Claims, 1 Drawing Sheet

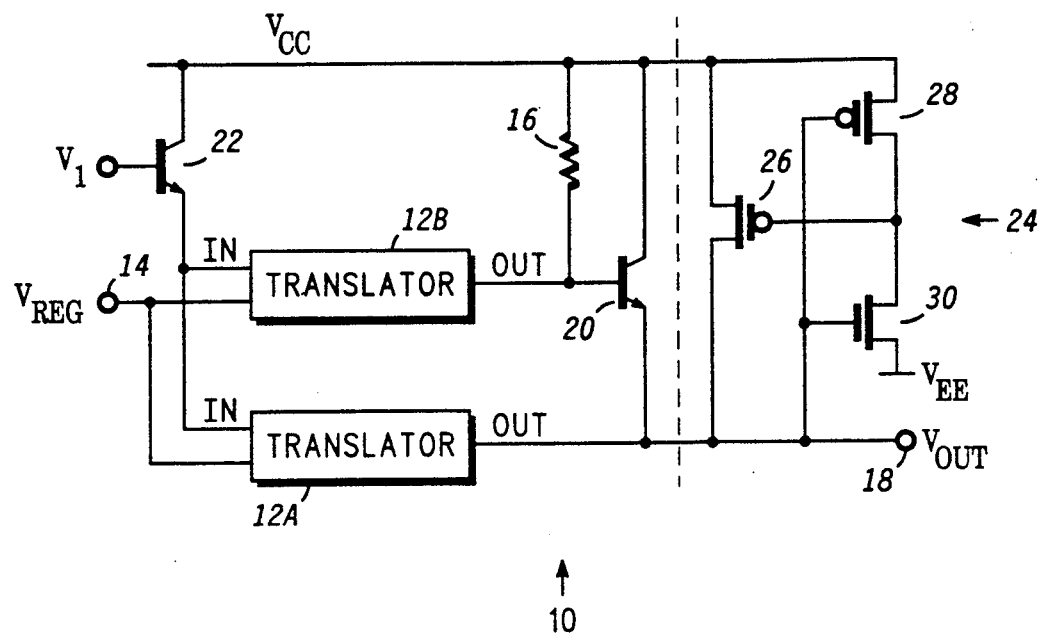
FIG. 1
FIG. 2
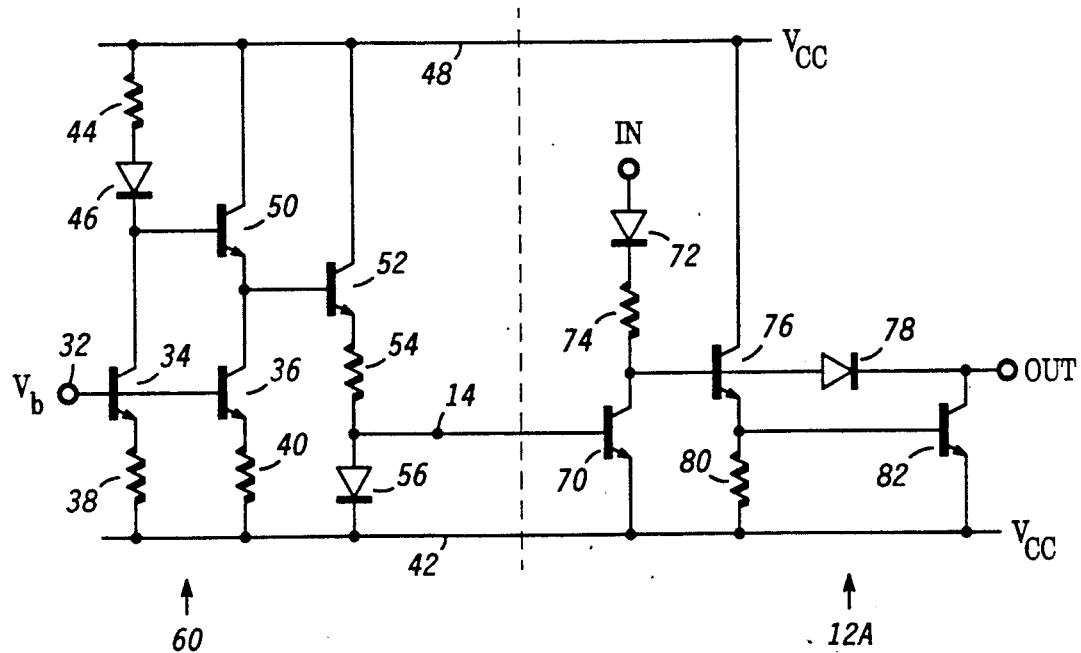

ECL TO CMOS LOGIC TRANSLATOR

BACKGROUND OF THE INVENTION

The present invention relates logic signal translator circuits and, more particularly, to a BICMOS translator circuit for translating ECL input signals to CMOS logic level output signals.

There is a myriad of prior art logic signal level translator which are responsive to logic input signal of a first logic level for providing output logic signals compatible to a second logic level. For example, a typical logic circuit may receive ECL inputs signals which switch between 0.0 and −0.8 volts representative of a logic one and logic zero accordingly. The output of the logic circuit may have to drive CMOS logic circuitry that requires logic signal swings between 0.0 and −5.2 volts (typical) for operation. Thus, the ECL signal level must be translated to the greater CMOS logic signal voltage swing which requires the use of translator circuitry.

Prior art ECL to CMOS logic voltage level translator circuits are known in the art. For instance, U.S. Pat. No. 4,644,194 as well as a patent application entitled, "HIGH SPEED ECL TO CMOS TRANSLATOR HAVING REDUCED POWER CONSUMPTION", Ser. No. 445,529, assigned to Motorola, Inc. disclose such translators to which the subject invention is related. Although, prior art translator circuits work reasonably well they may suffer from several disadvantages to which the subject application addresses. Most, if not all, prior art translator circuits for driving CMOS logic circuitry from a different input logic level require some sort of buffer circuit to isolate the translator from the load. In general, the need for a buffer circuit increases switching time delays which is undesirable. In addition, prior art translator circuits of the type mentioned above may suffer in performance due to substantial variations in the power supply voltage and temperature.

Hence, a need exists for a high speed ECL to CMOS logic voltage translator which is independent to variation in power supply voltage levels and temperature which does not require buffer circuitry between the output thereof and the CMOS load that is driven therefrom.

SUMMARY OF THE INVENTION

Accordingly, it is an object of the present invention to provide an improved ECL to CMOS voltage level translator circuit.

It is another object of the present invention to provide an ECL to CMOS translator circuit including an output stage that can directly drive CMOS loads without requiring a separate buffer interface therebetween.

In accordance with the above and other objects there is provided an ECL to CMOS translator including a pair of identical translator circuit portions each having an input for receiving a representative ECL logic signal and a respective output, and an output stage coupled to the respective outputs of the pair of translator circuit portions and having an output coupled to the output of the translator for providing CMOS logic level output signals thereat responsive to the applied ECL input signals.

A feature of the present invention is that the translator includes a regulator circuit that provides multiple fan out capabilities which is coupled to an individual input of each translator circuit portion for forming a current mirror therewith such that the translator is independent to variations in the power supply and temperature.

BRIEF DESCRIPTION OF THE DRAWING

FIG. 1 is a partial schematic and block diagram of the translator circuit of the present invention; and FIG. 2 is a schematic diagram illustrating the translator and regulator circuitry of the embodiment of FIG. 1.

DETAILED DESCRIPTION OF THE PREFERRED EMBODIMENT

Turning to FIG. 1 there is shown BICMOS translator circuit 10 of the present invention which converts ECL logic level input signals to CMOS logic level output signals. As appreciated, translator circuit 10 is suited to be manufactured in integrated circuit from using conventional processes. Circuit 10 is comprised of a pair of translator 12a and 12b which may have identical components as will be described in more detail in reference to FIG. 2. The translators 12a and 12b are quasi-parallel coupled between common inputs and the output of the translator circuit. The output of the first translator 12a is directly coupled to output 18 while that of translator 12b is coupled to an output stage comprising resistor 16 and NPN transistor 20. Resistor 16 is coupled between a first power supply conductor to which Vcc is applied and the output of translator 12b while the collector of transistor 20 is coupled to Vcc and its base is coupled to the output of translator 12b. The emitter of transistor 20 is connected to output 18. A regulated voltage Vreg is supplied at terminal 14 to both translator 12a and 12b which tracks with temperature and supply voltage Vee as will be discussed hereinafter. An ECL logic input signal, V1, is applied at the base on NPN transistor 22 which acts as a voltage level shifter having its emitter coupled to the respective inputs of translators 12a and 12b and its collector coupled to Vcc.

In a typical situation, V1, varies between a high logic level of 0.0 volts and a low logic level of 31 0.8 volts (with respect to Vcc) where Vcc is equal to 0.0 volts and Vee has a typical value of −5.2 volts. Transistor 22, being coupled as an emitter-follower voltage level shifts the input signal V1 to a corresponding level shifted signal that is applied to the inputs of translators 12a and 12b. In operation then, as V1 is a logic high, the outputs of the two translators are low. Hence Vout is set to a first predetermined level that, as will be explained, is substantially equal to the value of Vee or −5.2 volts. Simultaneously, transistor 20 (which is also configured as an emitter-follower) is turned off as the output of translator 12b is low. When V1 is in a low logic state, the outputs of translators 12a and 12b are turned off. This permits the output stage comprising transistor 20 to be rendered operative as the base of transistor 20 rises toward Vcc via resistor 16. As soon as transistor 20 is turned on as its base potential rises, Vout will be set to a second predetermined voltage level that approaches the value of Vcc. Hence, the ECL logic input signal has been translated to a CMOS compatible logic signal that varies between 0.0 an −5.2 volts.

A CMOS latch type circuit 24 may be used to extend the high logic level of Vout to nearly Vcc. Latch circuit 24 includes PMOS transistor 26 having its drain-source conduction path coupled between Vcc and output 18 and its gate coupled to the interconnected source and drain of PMOS transistor 28 and NMOS transistor 30 respectively. The drain of transistor 28 is coupled to Vcc while the source of transistor 30 is returned to Vee. The gates of transistors 28 and 30 are interconnected to output 18.

Thus, transistor 30 will tend to be turned on as output 18 goes to a logic one as the turn on voltage threshold of the transistor is exceeded responsive to V1 being in a low logic state. Hence, the gate of transistor 26 is pulled low with respect to Vcc thereby turning transistor 26 on to latch Vout to Vcc.

Turnning to FIG. 2 there is shown translator 12a in combination with regulator circuit 60 the latter of which provides the voltage Vreg. It is understood that translator 12b is identical to translator 12a and would be coupled to output 14 of regulator 60 in a like manner. In the following discussion it is to be understood that the described diodes may be formed by transistors having their base and collector interconnected which corresponds to the anode of the diode while the emitter of the transistor corresponds to the cathode of the diode. A previously mentioned, regulator 60 provides a voltage Vreg at terminal 14 that tracks with temperature and Vee. The manner in which this is accomplished will now be discussed.

Regulator 60 is supplied a bias voltage Vb at terminal 32 the magnitude of which is independent of Vee. Terminal 32 is coupled to the bases of NPN transistors 34 and 36 the emitters of which are coupled via respective resistors 38 and 40 to power supply conductor 42 the latter of which is operated at the potential Vee. The collector of transistor 34 is returned to Vcc, supplied at conductor 48 via series connected resistor 44 and diode 46. The collector of transistor 36 is connected to the emitter of PNP transistor 50 the base of the latter being coupled to the collector of transistor 34 and its collector being coupled to conductor 48. The emitter of transistor 50 is also coupled to the base of NPN transistor 52 which has its emitter coupled to one end of resistor 54 while its collector is returned to conductor 48. The other end of resistor 54 is coupled both to the anode of diode 56 and terminal 14 while the cathode of the diode is returned to conductor 42.

In normal operation of translator circuit 10 regulator section 60 is biased such that the voltage V44 developed across resistor 44 is equal to half the ECL voltage swing, i.e., V1/2, or about −0.4 volts. Transistor 50 is thus conducting which biases transistor 52 on to supply current through resistor 54 and diode 56 to Vee. The combination of diode 56 and transistor 70 of the particular translator 12a or 12b, etc. forms a well known current mirror whereby the current flowing through resistor 74 and diode 72, which are series connected between the input of the translator and the collector of transistor 70 is made proportional to the current flow through resistor 54. The voltage developed across resistor 74 therefore tracks with Vee in a predetermined range, for example, −4.0 to −6.0 volts. If resistors 54 and 74 are correctly rationed with respect to one another, the respective voltage drops across the resistor will be equal. Hence, any change in current through the current mirror circuit of diode 56 and transistor 70 is absorbed across the aforementioned resistors such that the voltage at the collector of transistor 70 remains constant with respect to Vee. The use of diode 56 forms a current mirror with the individual transistor 70 of translator 12a and 12b having multiple fan out capabilities.

The translators 12a and 12b further include transistor 76 having its base coupled to the collector of transistor 70, its collector coupled to power supply conductor 48 and its emitter coupled by resistor 80 to power supply conductor 42. Output transistor 82 has its base coupled to the emitter of transistor 76 and its collector connected to the output of the translator while its emitter is coupled to power supply conductor 42. A clamping diode 78 is coupled between the base of transistor 76 and the collector of transistor 82.

If the ECL signal V1 applied at the base of emitter follower transistor 22 is in a high logic state (0.0 volts) the input voltage supplied at the input, IN, of the respective translator 12a or 12b is equal to approximately −0.8 volts which is the voltage drop appearing across the base-emitter of transistor 22. This potential is sufficient to forward bias transistor 76 which in turn supplies sufficient current through resistor 80 to forward bias output transistor 82. The output of the tranlators then will be driven to a low logic state as transistor 82 sinks current at the output of the translators. The low logic potential developed at the output of the translators is approximately equal to a base-emitter voltage drop higher then Vee, i.e., the voltage at the output with respect to Vee is:

$$V_{BE82} + V_{BE76} - \phi_{78}$$

where:
$V_{BE82}$ is the base-emitter voltage drop of transistor 82,
$V_{BE76}$ is the base-emitter voltage drop of transistor 76, and
$\phi_{78}$ is the voltage drop across diode 78.

Likewise, if V1 is at a logic low state (−0.8 volts) the potential developed at the base of transistor 76 is insufficient to produce a voltage a across resistor 80 to forward bias transistor 82. Hence, the output of the translator is free to rise to a predetermined level. Referring back to FIG. 1, the output of translator 12b will therefore rise toward Vcc through resistor 16 and the output of translator 12a (Vout) will rise to Vcc due to CMOS latch 24.

It is realized that additional ECL logic inputs may be applied to translator circuit to provide a predetermined logic function. For example multiple input transistors each having a base for receiving an ECL logic input signal, a collector coupled to Vcc and an emitter coupled to the emitter of transistor 22 would be provided to produce a logic NOR function through translator circuit 10.

It should be understood that if a full CMOS latch circuit is utilized in place of described latch circuit 24 that the output swing of the logic output signal Vout can be driven essentially to both Vcc and Vee. However, the disadvantage of using a full latch circuits that additional power must be dissipated due to current flowing through clamping diode 78. In the present case, a full latch circuit would require an additional NMOS transistor that would have its drain coupled to the source of transistor 26 (FIG. 1), its source coupled to Vee and its gate coupled to the gate of transistor 26.

Hence, what has been described above is a novel translator circuit comprised of a pair of quasi-parallel connected translators that are responsive to an ECL logic signal for providing a corresponding logic output signal having a different logic level, i.e., a CMOS logic level between Vcc and Vee. The translator circuit includes an output stage that eliminates the need for a buffer circuit between the output of the translator and a given load that is driven therefrom as required heretofore thereby reducing the time delay of the translator circuit.

What is claimed is:

1. Circuit responsive to at least one input logic signal of a first logic level applied at an input thereof for providing an output logic signal at an output of a different logic level, comprising:
   a first translator circuit coupled between the input and output of the circuit which is responsive to the input signal being in a first logic state for setting the output of the circuit to a first predetermined voltage level;
   an output stage for setting the output of the circuit to a second predetermined voltage level when rendered operative; and
   a second translator circuit coupled between the input and said output stage which is responsive to the input signal being in said first logic state for rendering said output stage inoperative and being responsive to the input signal being in a second logic state for rendering said output stage operative wherein said first and second predetermined voltage levels correspond to the output logic signal of a different logic level.

2. The circuit of claim 1 including:
   a first power supply conductor, and
   at least one input transistor having a base coupled to the input of the circuit, and emitter coupled to inputs of said first and second translator circuits and a collector coupled to said first power supply conductor.

3. The circuit of claim 2 wherein said output stage includes:
   a first resistor coupled-between an output of said second translator circuit and said first power supply conductor; and
   a first translation having a collector coupled to said first power supply conductor, a base coupled to said output of said second translator circuit and an emitter coupled both to the output of the circuit and output of said first translator circuit.

4. The circuit of claim 3 wherein said output stage includes a latch circuit coupled between said first power supply conductor and the output of the circuit.

5. The circuit of claim 3 wherein each of said first and second translator circuits include:
   a regulator circuit portion for providing a substantially constant predetermined voltage at an output thereof; and
   a translator circuit portion having an input coupled to the input of the respective translator circuit.

6. The circuit of claim 5 wherein said translator circuit portion includes:
   a Second power supply conductor;
   a second transistor having a base coupled to said output of said regulator circuit, a collector, and an emitter coupled to said second power supply conductor,
   a second resistor coupled between said input of said translator circuit portion and said collector of said second transistor;
   first circuit means coupled to said collector of said second transistor for providing a first predetermined potential when the input logic signal is in a first logic state and a second predetermined potential when the input logic signal is in a second logic state;
   a third transistor having a base coupled to said first circuit means, a collector coupled to said output of the translator circuit portion, said output being coupled to the output of the respective translator circuit and an emitter coupled to said second power supply conductor, said third transistor being rendered conductive resposive to said first predetermined potential and being rendered non-conductive responsive to said second predetermined potential being applied to the base thereof; and
   means coupled between said collector of said second transistor and said collector of said third transistor for clamping the potential at the collector of said third transistor to a predetermined value when said third transistor is conductive.

7. The circuit of claim 5 wherein said regulator circuit portion includes:
   a second power supply conductor,
   first circuit means coupled between said first and second power supply conductors which is responsive to a bias potential supplied thereto for providing a predetermined potential at an output thereof;
   a second transistor having a collector coupled to said first power supply conductor, a base coupled to said output of said first circuit means and an emitter;
   first diode means coupled between said output of said regulator circuit portion and said second power supply conductor; and
   a second resistor coupled between said emitter of said second transistor and said output of said regulator circuit portion.

8. The circuit of claim 7 wherein said first circuit means includes:
   third and fourth transistors each having a base to which said bias potential is applied, and emitter coupled to said second power supply conductor and a collector;
   a fifth transistor having a base coupled to said collector of said third, transistor, a collector coupled to said first power supply conductor and and emitter coupled both to said collector of said fourth transistor and said output of said first circuit means;
   a second resistor; and
   second diode means coupled in series with said second resistor between said first power supply conductor and said collector of said third transistor.

9. The circuit of claim 6 wherein said regulator circuit portion includes:
   first circuit means coupled between said first and second power supply conductors which is responsive to a bias potential supplied thereto for providing a predetermined potential at an output thereof;
   a fourth transistor having a collector coupled to said first power supply conductor, a base coupled to said output of said first circuit means and an emitter;
   first diode means coupled between said output of said regulator circuit portion and said second power supply conductor; and
   a third resistor coupled between said emitter of said fourth transistor and said output of said regulator circuit portion.

10. The circuit of claim 9 wherein said first circuit means includes:

fifth and sixth transistors each having a base to which said bias potential is applied, an emitter coupled to said second power supply conductor and a collector;

a seventh transistor having a base coupled to said collector of said fifth transistor, a collector coupled to said first power supply conductor and an emitter coupled both to said collector of said sixth transistor and said output of said first circuit means;

a fourth resistor; and second diode means coupled in series with said fourth resistor between said first power supply conductor and said collector of said fifth trasistor.

* * * * *

UNITED STATES PATENT AND TRADEMARK OFFICE
CERTIFICATE OF CORRECTION

PATENT NO. : 5,038,057

DATED : August 6, 1991

INVENTOR(S) : Robert Dixon and Walter Seelbach

It is certified that error appears in the above-identified patent and that said Letters Patent is hereby corrected as shown below:

Column 5, line 30, claim 2, change "and" to --an--.

Column 5, line 36, claim 3, change "coupled-between" to --coupled between--.

Column 5, line 39, claim 3, change "translation" to --transistor--.

Column 5, line 56, claim 6, change "Second" to --second--.

Signed and Sealed this

Ninth Day of February, 1993

Attest:

STEPHEN G. KUNIN

*Attesting Officer*  Acting Commissioner of Patents and Trademarks